United States Patent [19]

Urbanik

[11] 4,442,423
[45] Apr. 10, 1984

[54] OPTICAL POSITION SENSOR INCLUDING A SPECIALLY DESIGNED ENCODER PLATE

[75] Inventor: Peter J. Urbanik, Wethersfield, Conn.

[73] Assignee: United Technologies Corporation, Hartford, Conn.

[21] Appl. No.: 337,909

[22] Filed: Jan. 8, 1982

[51] Int. Cl.³ .......................................... H03K 13/02
[52] U.S. Cl. .......................... 340/347 P; 250/231 SE; 340/347 M
[58] Field of Search ..................... 340/347 M, 347 P; 250/231 SE, 237 G

[56] References Cited

U.S. PATENT DOCUMENTS 4,275,965 6/1981 Snitzer et al. .............. 250/237 G X Primary Examiner—T. J. Sloyan
Attorney, Agent, or Firm—David L. Adour

[57] ABSTRACT

An optical position sensor for monitoring displacements of a movable body is disclosed. The sensor includes a light source transmitter, a light sensing receiver, a digital switching device, and a special encoder plate attached to a movable body. The encoder plate has rows of apertures which are constructed to modulate the light signal transmitted between the transmitter and receiver as a function of plate position to provide a symmetrical digital output signal when the switching device is triggered at a preset practical minimum threshold level. Fiber optics are particularly suitable for use in constructing such an optical position sensor.

5 Claims, 3 Drawing Figures

OPTICAL POSITION SENSOR INCLUDING A SPECIALLY DESIGNED ENCODER PLATE

BACKGROUND OF THE INVENTION

This invention relates to optical position sensors and more particularly relates to encoder plates used in fiber optic position sensors for monitoring displacements of movable bodies. Also, this invention relates to a method of designing an optical position sensor.

U.S. Pat. Nos. 4,275,965, 4,117,460, and 4,116,000 relate to fiber optic position sensors for monitoring displacements of movable bodies. Specifically, U.S. Pat. No. 4,275,965 relates to a high resolution optical sensor, utilizing fiber optic encoder plates for measuring the position of a reciprocating device over a long stroke distance. U.S. Pat. Nos. 4,117,460 and 4,116,000 relate to optical position sensors having conventionally designed encoder plates and utilized in systems for controlling variable engine parameters of a modern gas turbine engine, such as fuel flow, flow-path contour, and pressure along the flow path.

In general, fiber optic position sensors comprise a light source transmitter, a light sensing receiver, an encoder plate (located between the light transmitter and the receiver) for modulating light as a function of position, and a digital switching device triggered by a preset threshhold level of light output sensed at the receiver. The encoder plate comprises several rows of apertures in a plate which is attached to a body, whose position it is desired to monitor, so that the plate moves between the light transmitter and light receiver in response to displacements of the body. Each row of apertures forms an information channel. Typically, the position sensor is designed so that the digital switching device produces several symmetrical digital output signals in response to the light output sensed at the receiver as a function of encoder plate position. Such symmetrical digital output signals may be easily processed by electronic circuitry which is relatively uncomplicated in design and operation and which is relatively inexpensive to construct. Conventionally, in order to produce the desired symmetrical digital output signals, each information channel on the encoder plate is constructed with apertures of equal length which are equally spaced from each other a distance equal to the length of an aperture and the threshhold level of the digital switching device is preset at one-half of the designed (nominal) maximum amplitude of the light output at the receiver.

The symmetry of the digital output signals, and therefore, the accuracy of the fiber optic position sensor, depends on maintaining the light signal amplitude, sensed at the receiver, at the designed operating levels. However, the position sensor is usually located in a hostile operating environment and variations in the amplitude of the light output sensed at the receiver may occur due to varying operating temperatures, degradation in the operating characteristics of the sensor due to aging of the equipment, breakage of optic fibers, and the accumulation of dirt and oil on the encoder plate. These operating conditions cause undersirable variations in the accuracy of the position measurements which are proportional to the amplitude of the light transmissions.

SUMMARY OF THE INVENTION

Therefore, an object of the present invention is to improve the accuracy of optical position sensors.

Another object of the present invention is to provide a fiber optic position sensor having a reduced sensitivity to undesirable light signal amplitude variations, such as variations caused by changes in operating temperatures, aging of the sensor, breakage of optical fibers, and other such factors, which result in position measurement accuracy variation which are porportional to the magnitude of the light signal amplitude.

A further object of the present invention is to improve methods of designing optical position sensors to improve their accuracy.

These and other objects of the present invention are attained by an optical position sensor comprising a light source transmitter, a light sensing receiver, a digital switching device, and an encoder plate having several rows of apertures of special configuration forming information channels which allow the digital switching device to be operated at a minimum practical threshhold level. The encoder plate is attached to a movable body whose position is desired to be monitored. The plate is located between the heads of the receiver and transmitter to modulate the transmitted light signal as a function of plate position. A symmetrical digital output signal is generated as a function of plate position and the optical position sensor is relatively insensitive to light signal amplitude variations which cause position measurement accuracy variations which are proportional to the amplitude of the light signal transmissions. The encoder plate is constructed with each information channel having a linear series of alternating apertures and opaque sections spaced a fixed distance apart with each aperture having a length, L, given by:

$$L = (I + 2T)D$$

where,
- I = a selected positive integer which varies from row to row
- T = the ratio, which is less than one-half, of the preset threshhold level of the digital switching device to the designed maximum output light signal amplitude at the receiver, and
- D = the beam width of the transmitted light signal from the optical transmitter. and with each opaque section having a length, OP, given by:

$$OP = 2(I + 1)D - L$$

In this manner, the encoder plate is constructed so that the desired symmetrical digital output signal is attained for any preset threshhold level of the digital switching device. Thus, the optical position sensor may be operated at relatively low preset threshhold levels, such as at a minimum practical threshhold level, whereby the sensor is less sensitive to light signal amplitude variations which cause position measurement accuracy variations which are proportional to the amplitude of the light signal transmissions.

BRIEF DESCRIPTION OF THE DRAWING

Other objects and advantages of the present invention will be apparent from the following detailed description in conjunction with the accompanying drawings in which.

DETAILED DESCRIPTION OF THE PREFERRED EMBODIMENT

Figure 1:
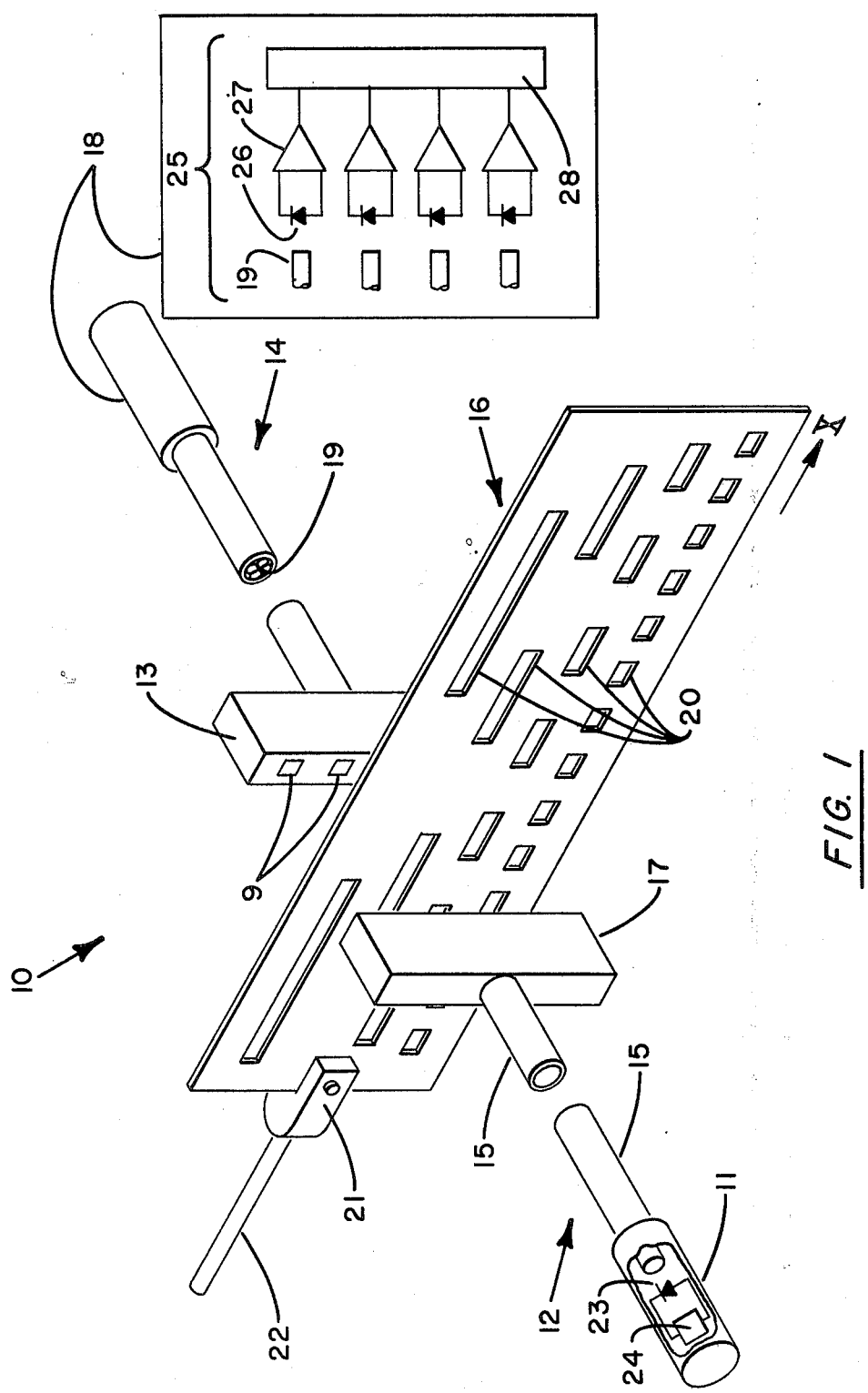
FIG. 1 illustrates a fiber optic position sensor having an encoder plate constructed according to the principles of the present invention.

Referring to FIG. 1, a fiber optic position sensor 10 constructed according to the principles of the present invention is shown. The sensor 10 comprises a light signal transmitter 12, a light signal receiver 14, and an optical mask or encoder plate 16. The light signal transmitter 12 includes an optical transmitter section 11 connected by a central fiber optic way 15 to a transmitter head or sending block 17. The width of the face of the transmitter head 17 is equal to the beam width of the transmitted light signal from the transmitter 12. The light signal receiver 14 includes an optical receiver section 18, four relatively small fiber optic ways 19, and a receiver head or receiver block 13 having four openings 9 each of which corresponds to one of the small fiber optic ways 19. The transmitted light signal from the transmitter 12 is received and sensed at each of the openings 9 of the receiver 14. The width of each of the openings 9 is equal to the beam width of the transmitted light signal which is equal to the width of the transmitter head 17.

The encoder plate 16 has four rows of slots or apertures 20. Each row of apertures 20 corresponds to one of the fiber optic ways 19 and each of the ways 19 corresponds to one channel or bit of information. As the encoder plate 16 is displaced along the X-axis different light transmission patterns are established at the receiving block 13. The plate 16 is attached trhough a suitable mechanical connector 21 and shaft 22 to sense the position of a movable body (not shown) and is displaced back and forth along the X-axis in response to certain selected movements of the body.

The central fiber optic way 15 is connected to the optical transmitter section 11 so that one or more light emitting diodes (LED) are connected individually to fiber optic ways, or, as shown in FIG. 1, so that a single LED 23 is connected in common to a fiber optic bundle to pipe light through the bundle to the face of the sending block 17. The LED 23 is driven by electrical circuitry including an LED driver 24. The smaller fiber optic ways 19 terminate at a digital switching device 25 which includes individual LED detectors 26 for monitoring the light signal of each fiber optic way 19. The monitored light signals are amplified by amplifiers 27 and processed by electronics 28 of the digital switching device 25.

In operation, the displacement of the encoder plate 16 through the light transmission path established between the transmitter 12 and the receiver 14 causes preselected interuption of light transmission through each information channel depending on the location within the light path of the apertures 20 at a particular time. As shown in FIG. 1, a particular code pattern may consist of four rows of apertures 20 wherein the apertures 20 within a given row are of equal length and are spaced equally apart. Each row of apertures 20 has a different aperture length and the positions of the apertures 20 in any given row are selectively staggered relative to the positions of the apertures 20 in any other row.

The digital switching device 25 located in the receiver section 18 generates an electronic digital output signal for each information channel and processes the information from each channel of the receiver 14. The electronic digital ooutput signals are keyed to the magnitude of the light output signals at the receiver 14 for each information channel. The signal processing electronics 28 of the switching device 25 is less costly and less complex if the digital output signals generated by the digital switching device 25 are symmetrical, that is, if the off and on times of the digital output signals are substantially equal for each information channel as a function of position of the encoder plate 16.

Figure 2:
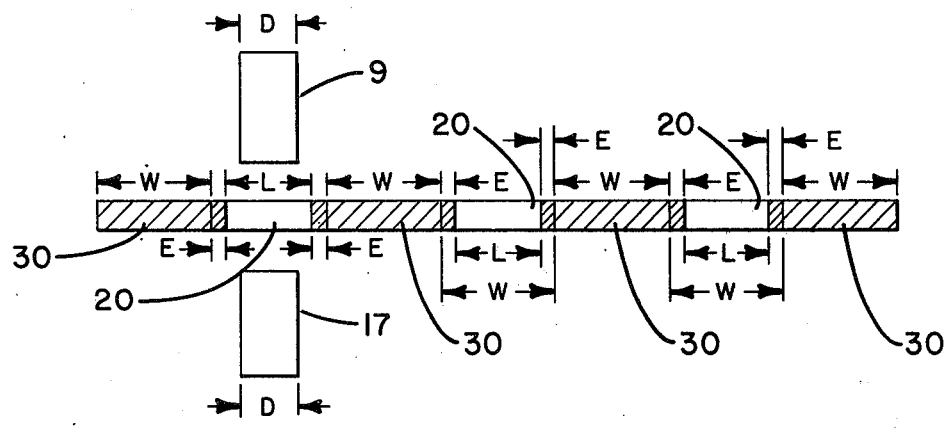
FIG. 2 is a view in cross section of one information channel of the encoder plate shown in FIG. 1.

As shown in FIG. 2, a conventional design for the encoder plate 16, to produce symmetrical digital output signals, is to have opaque sections 30 and apertures 20 both of length W and to set the threshhold level for activating the digital electronics of the digital switching device 25 at one-half the designed maximum amplitude of the light signal output sensed at the receiver 14. (The opaque sections are shown by the cross-hatched areas in FIG. 2.) As shown in FIG. 2, the opening 9 in the receiver head 13 and the face of the transmitter head 17 each has a width D corresponding to an effective light signal beam width of the same width D.

Also, as shown in FIG. 2, small opaque extensions, E, of the opaque sections, W, correspond to the encoder plate 16 which is constructed according to the principles of the present invention. The extensions, E, at each edge of an aperture 20 reduce the length of each aperture 20 by an amount, 2E, to a length, L, thereby allowing the digital switching electronics to operate at a practical minimum threshhold level.

Figure 3:
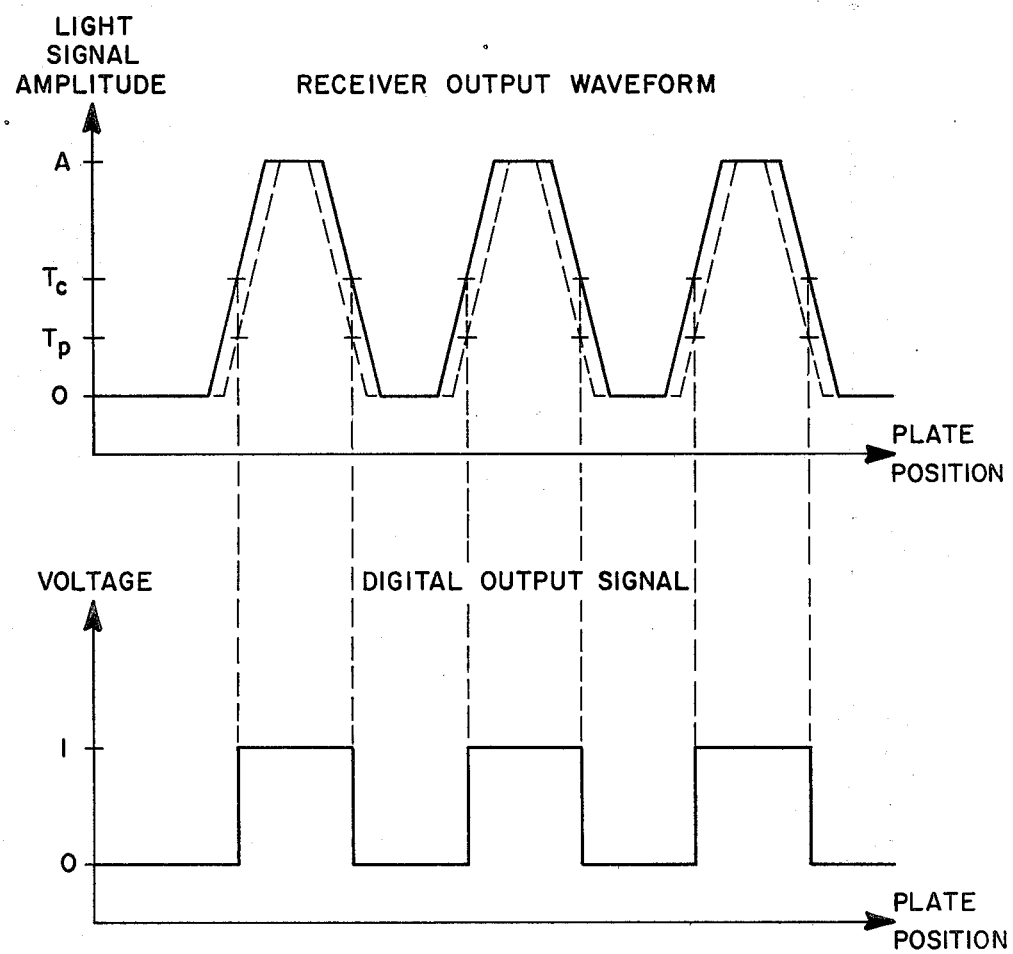
FIG. 3 is a graph of light signal output at the receiver and corresponding digital output signal as a function of plate position for the information channel of the encoder plate whose cross section is shown in FIG. 2.

Referring to the upper graph of FIG. 3, the amplitude of the light signal output sensed at the receiver 14 and the corresponding digital output signal as a function of encoder plate position are shown for a conventionally constructed encoder plate (solid line) and an encoder plate 16 constructed according to the principles of the present invention (dotted line). The designed maximum light signal output amplitude at the receiver 14 is designated A in FIG. 3. The conventional preset threshhold level for activating the digital switching device 25 is designated $T_C$, which is one-half of the designed maximum receiver light output amplitude, A. The level $T_P$ which is a practical minimum threshhold level, is the optimal threshhold level which may be set for the encoder plate 16 constructed according to the principles of the present invention.

Referring to the lower graph of FIG. 3 showing voltage as a function of plate position, it can be seen that when the conventional threshhold level, $T_C$, which is one-half the designed maximum receiver output light signal amplitude, A, is selected as the threshhold level for the digital switching device 25, a digital voltage output signal is generated which has equal on and off periods as a function of plate position. However, with the design of the plate 16 modified, according to the principles of the present invention, to have the opaque extensions, E, the threshhold level for activating the digital switching device 25 is set at the practical minimum threshhold level $T_P$ to produce the same symmetrical digital output signal. This is a significant advantage because light output amplitude variations at the receiver, which are proportional to the light signal amplitude, are less at $T_P$ than at $T_C$. This means that if such variations occur then there is a smaller shift in position of the digital output signal as a function of plate position, and, therefore, a correspondingly smaller error in position measurement, for a sensor 10 operating at a threshhold level, $T_P$, as compared to a sensor operating at a higher threshhold level, $T_C$. For example, if $T_P=T_C/2$, and a fixed percentage amplitude degradation occurs due to aging of the equipment or such other factors as described previously, then the shift in the position of the leading edge of the digital output pulse, when the threshhold level is $T_C$, is twice as great as the shift when the threshhold level is $T_P$.

According to the principles of the present invention, the length, L, of any aperture 20 in a given row of the encoder plate 16 is given by:

$$L=(I+2T)D$$

where,
I = a selected positive integer which varies from row to row
T = the ratio, which is less than one-half, of the preset threshhold level of the digital switching device to the designed maximum output light signal amplitude at the receiver, and
D = the beam width of the transmitted light signal from the optical transmitter. and the length, OP, of any opaque section in a given row of the encoder plate 16 is given by:

$$OP=2(I+1)D-L$$

Preferably, the integer, I, is selectively varied from row to row to establish a desired pattern of apertures 20 on the encoder plate 16. For example, for the encoder plate 16 shown in FIG. 1, the integer, I, is largest for the top row of the plate 16 and sucessively decreases for each lower row. For a conventional encoder plate $T=\frac{1}{2}$ and the length, L, of any aperture 20 is an integer multiple of the transmitter head width D which is equal to the transmitted light signal beam width. For purposes of the present invention the preset threshhold level is always selected to be less than the conventional threshhold level, $T_C$. Therefore, for an encoder plate constructed according to the principles of the present invention, the ratio T is always less than one-half. In fact, it is desirable to have the ratio, T, at the lowest possible value since the plate 16 is primarily constructed, according to the principles of the present invention, to reduce errors which are directly proportional in magnitude to the amplitude of the light signal transmissions. Of course, the ratio T must have some positive, finite value because a minimum light signal amplitude is required to operate the digital switching device 25 of the receiver 14. Furthermore, normal operating degradations of the digital switching device 25 and the receiver 14 may require selecting a threshhold level for the device 25 which is greater than the absolute minimum value at which the sensor 10 just begins to function. The practical minimum threshhold level, $T_P$, is that minimum level which insures that the digital switching device 25 will operate throughout the normal operating life of the sensor 10. However, it should be noted that operating improvements and advantages still are attained if the threshhold level is set at a value above the practical minimum threshhold level, $T_P$, but less than the conventional threshhold level, $T_C$.

In general, the foregoing description is directed to a particular optical position sensor having a four channel encoder plate. However, it should be noted that the principles of the present invention are applicable to a large number of other encoder plate configurations which may be used as part of other kinds of sensors. Therefore, while the present invention has been described in conjunction with a particular embodiment it is to be understood that various modifications and other embodiments of the present invention may be made without departing from the scope of the invention as described herein and as claimed in the appended claims.

What is claimed is:

1. An optical position sensor comprising:
   an optical transmitter for transmitting a substantially constant amplitude light signal;
   an optical receiver for receiving the light signal transmitted by the optical transmitter and for generating an output light signal in response thereto;
   a digital switching device for monitoring the optical output light signal at the receiver and for generating a high level output signal when the monitored light signal exceeds a threshhold level which is set at less than one-half of the designed maximum output light signal amplitude at the receiver; and
   an encoder plate located between the optical transmitter and the optical receiver for modulating the light transmissions from the transmitter to the receiver as a function of plate position, said encoder plate having at least one information channel having a linear series of alternating apertures and opaque sections with each aperture having a length, L, given by:

$$L=(I+2T)D$$

where,
I = a selected positive integer which may vary from row to row depending on the code pattern which it is desired to establish on the plate
T = the ratio, which is less than one-half, of the preset threshhold level of the digital switching device to the designed maximum output light signal amplitude at the receiver, and
D = the beam width of the transmitted signal from the optical transmitter
and with each opaque section having a length, OP, given by:

$$OP=2(I+1)D-L$$

whereby a symmetrical digital output signal is generated as a function of encoder plate position for each information channel having such apertures and opaque sections.

2. The optical position sensor as recited in claim 1 wherein the preset threshhold level of the digital switching device is approximately equal to a practical minimum threshhold level at which the digital switching device is substantially certain to operate throughout a normal operating life of the optical position sensor.

3. An optical position sensor as recited in claims 1 or 2 wherein the optical transmitter and optical receiver each comprise at least one fiber optic light way and wherein the digital switching device comprises electronic circuitry including a photosensitive diode(s) for detecting the output light signal from the optical receiver fiber optic light way(s).

4. An encoder plate for a position sensor of the type wherein the encoder plate is located between a light transmitter and a light receiver to modulate the light transmissions from the transmitter to the receiver as a function of plate position and wherein a digital switching device generates a high level output signal only when the output light signal amplitude at the receiver exceeds a preset threshhold level which is less than one-half of the designed maximum ouput light signal amplitude at the receiver, said encoder plate comprising:

at least one information channel having a linear series of alternating apertures and opaque sections with each aperture having a length, L, given by:

$$L=(I+2T)D$$

where,
I = a selected positive integer which may vary from row to row depending on the code pattern which it is desired to establish on the plate
T = the ratio, which is less than one-half, of the preset threshhold level of the digital switching device to the designed maximum output light signal amplitude at the receiver, and
D = the beam width of the transmitted light signal from the optical transmitter and with each opaque section having a length, OP, given by:

$$OP=2(I+1)D-L$$

whereby a symmetrical digital output signal is generated as a function of encoder plate position for each information channel having such apertures and opaque sections.

5. A method of designing an optical position sensor of the type wherein an encoder plate having at least one row of apertures and opaque sections, forming at least one information channel, is located between the heads of a light transmitter and a light receiver to modulate the light transmissions from the transmitter to the receiver as a function of plate position and wherein a digital switching device generates a high level output signal when the output light signal amplitude at the receiver exceeds a preset threshhold level, which comprises:

determining a practical minimum threshhold level at which the digital switching device is substantially certain to operate throughout a normal operating life of the optical position sensor;

setting the threshhold level of the digital switching device at a level which is less than one-half of the designed maximum output light signal amplitude at the receiver and which is approximately equal to the practical minimum threshhold level for the device; and spacing the apertures a fixed distance apart in each row on the encoder plate to provide a linear series of alternating opaque sections and apertures in each row with each aperture having a length, L, determined by the formula:

$$L=(I+2T)D$$

where,
I = a selected positive integer which may vary from row to row depending on the code pattern which it is desired to establish on the plate
T = the ratio, which is less than one-half, of the preset threshhold level of the digital switching device to the designed maximum output light signal amplitude at the receiver, and
D = the beam width of the transmitted light signal from the optical transmitter and with each opaque section having a length, OP, given by:

$$OP=2(I+1)D-L$$

whereby a symmetrical digital output signal is generated as a function of encoder plate position for each information channel having such apertures and opaque sections.

* * * * *